United States Patent
Hirano et al.

(10) Patent No.: US 6,815,962 B2
(45) Date of Patent: Nov. 9, 2004

(54) CONNECTION/INSPECTION DEVICE FOR SEMICONDUCTOR ELEMENTS

(75) Inventors: Takayuki Hirano, Kobe (JP); Yasuji Yoneda, Kobe (JP); Hiroshi Gotoh, Kobe (JP); Eiji Iwamura, Kobe (JP); Susumu Takeuchi, Miyoshi-machi (JP)

(73) Assignees: Kabushiki Kaisha Kobe Seiko Sho, Hyogo (JP); Genesis Technology Inc., Hyogo (JP)

( * ) Notice: Subject to any disclaimer, the term of this patent is extended or adjusted under 35 U.S.C. 154(b) by 71 days.

(21) Appl. No.: 10/216,836

(22) Filed: Aug. 13, 2002

(65) Prior Publication Data

US 2003/0034782 A1 Feb. 20, 2003

(30) Foreign Application Priority Data

Aug. 17, 2001 (JP) ........................................ 2001-247960

(51) Int. Cl.[7] .............................................. G01R 31/04
(52) U.S. Cl. ........................................ 324/754; 324/765
(58) Field of Search ................................ 324/754, 761, 324/762, 765, 755; 439/482; 29/592.593, 592.1; 428/139

(56) References Cited

U.S. PATENT DOCUMENTS

| | | | | | |
|---|---|---|---|---|---|
| 4,916,002 | A | * | 4/1990 | Carver ........................ | 428/139 |
| 5,177,439 | A | * | 1/1993 | Liu et al. .................... | 324/754 |
| 5,378,971 | A | | 1/1995 | Yamashita | |
| 6,005,288 | A | | 12/1999 | Farnworth et al. | |
| 6,198,300 | B1 | * | 3/2001 | Doezema et al. ........... | 324/762 |

FOREIGN PATENT DOCUMENTS

| JP | 7-283280 | 2/1995 |
|---|---|---|
| JP | 9-159696 | 12/1995 |

OTHER PUBLICATIONS

"Metallische Werkstoffe, Physikalische Eigenschaften", HUG Industrieltechnik und Arbeitssicherheit GmbH, Ergolding, Deutschland; http://www.hug–technik.com/inhalt/ta/metall.htm.

Official Letter dated Jun. 24, 2004 from German application 10237499.6 filed Aug. 16, 2002 which mentions the above references (4 pages), with English translation (4 pages).

* cited by examiner

*Primary Examiner*—Vinh P. Nguyen
(74) *Attorney, Agent, or Firm*—Reed Smith LLP; Stanley P. Fisher, Esq.; Juan Carlos A. Marquez, Esq.

(57) ABSTRACT

There is provided an electric connection-inspection device which does not impair a freedom of selection of using materials from a viewpoint of restriction in terms of product's function with the aptitude of electric features of electric resistance and physical properties of internal stress, and restriction in terms of manufacture as to the appropriation or not of employment of a plating method, and which has a fine construction provided with the excellent durability that an electrode element is hard to adhere and coagulate. An electric connection-inspection device for coming into electrically contact with an object to be inspected to input and output a signal, comprising a plurality of contact terminals, a coating of a second layer having the Young's modulus higher than that of a wiring base-material layer and whose specific resistance is not more than $1 \times 10^{-4}$ $\Omega$cm being formed on the surface of the wiring base-material layer positioned at the extreme end of the contact terminal, and a coating of a third layer having a low coagulating property being formed on the surface of the second layer.

20 Claims, 5 Drawing Sheets

CONNECTION/INSPECTION DEVICE FOR SEMICONDUCTOR ELEMENTS

BACKGROUND OF THE INVENTION

1. Field of the Invention

The present invention relates to an electric connection-inspection device in which a plurality of contact terminals are brought into press and contact with electrodes of semiconductor elements or the like as inspection objects to input and output an electric signal thereby inspecting electric features thereof.

2. Description of the Related Art

Many semiconductor elements of LSI are provided on a semiconductor wafer, and they are cut and divided into chips for use with various products to be utilized of electric products. Normally, on the surfaces of these semiconductor chips are arranged with a number of electrodes along the circumferences thereof. In producing the semiconductors described above in volume industrially, a connection-inspection device generally called as a probe card is used in order to inspect their electric features.

This probe card is constituted by a card substrate 1 comprising a resin substrate in which a wiring is buried as shown in FIG. 1, and a contact terminal 2 comprising a metal needle projected obliquely therefrom. The actual inspection is carried out by rubbing an electrode 5 on a semiconductor wafer 4 by contact pressure making use of flexure of the contact terminal 2 to remove an oxide film naturally formed on the surface to attempt an electric contact. Further, also in case where these are inspected, before the elements cut and divided into the chips are actually mounted, there is used a connection-inspection device called a contactor (or a socket) having a number of contact terminals, which is constituted so that the contact terminals are likewise brought into contactor-contact with the elements to enable inspecting electric features. It is noted that also for inspection of electric features of various electronic devices such as a display unit, a connection-inspection device generally called a probe is being used.

With the recent trend of fineness of semiconductor elements, also as a connection element used to perform electric inspection thereof, a fine element has been proposed. For example, in Japanese Patent Laid-Open No. 283280/1995 Publication, there is proposed a probe card in which a contact terminal is formed by making use of a mold for anisotropy etching of silicone with a photolithography technique as a base, a hard plating material is formed therein, and a conductive layer is formed on the uppermost surface. Further, in Japanese Patent Laid-Open No. 159696/1997 Publication, there is also made a proposal in which a photolithography is used to form a wiring part, which is used as a connection terminal.

However, the conventional fine connection-inspection device as described has a disadvantage that since the entirety is originally fine, an extreme end of the contact terminal also becomes fine, strength is low, a breakage caused by abrasion or foreign matter tends to occur, and also durability is low.

On the other hand, for a wiring used in such a device as described, a low electric resistance is required naturally, but the wiring itself becomes fine due to the correspondence to fineness of the above device, that there poses a problem that the electric resistance of the wiring increases conversely. To cope with this, a material, thickness, and forming method of the wiring part are under fixed restriction, which is not preferable. The wiring part is often formed, generally, of gold, nickel, an alloy of copper, etc. However, a freedom in terms of selection of material is narrow due to the above-described electric restriction, and particularly it is difficult to apply material of high strength.

Moreover, even if materials of high strength and low electric resistance could be selected, these materials are so high in internal stress that a fully thick film is difficult to be formed, still failing to sufficiently achieve a function as a connection element.

Furthermore, as a problem in terms different from that mentioned above, there occurs a problem in that with the development of a semiconductor element using a bump such as solder and metal, an electrode element becomes adhered to and coagulated on the extreme end of a contact terminal, resulting in contact failure at the time of connection-inspection. For overcoming this problem, a periodical cleaning operation is necessary, and not only the inspection efficiency lowers but also the durability of the contact terminal is impaired.

It is therefore an object of the present invention, for solving the aforementioned problems, to provide an electric connection-inspection device which overcomes the aforementioned problems at a stroke, which does not impair a freedom of selection of using materials from a viewpoint of restriction in terms of product's function with the aptitude of electric features of electric resistance and physical properties of internal stress, and restriction in terms of manufacture as to the appropriation or not of employment of a plating method, and which has a fine construction provided with the excellent durability that an electrode element is hard to adhere and coagulate.

The present inventors have earnestly experimented and studied aiming at solving the problems as noted above, and as a result, have accomplished the present invention as industrially advantageous technical solving measures.

SUMMARY OF THE INVENTION

The present invention provides an electric connection-inspection device for coming into electrically contact with an object to be inspected to input and output a signal, comprising: a plurality of contact terminals and contact parts positioned at extreme ends of the contact terminals, the contact part comprising a first layer formed from a wiring base-material, a second layer formed on the surface of the first layer and comprising a coating of material having the Young's modulus higher than that of the wiring base-material and whose specific resistance is $1 \times 10^{-4}$ $\Omega$cm or less, and a third layer comprising a coating of material having a low coagulating property.

In the electric connection-inspection device constituted as described above, the second layer is preferably formed of a material having the Young's modulus of 150 GPa or more, its thickness is preferably 3 $\mu$m or more, and its material can be tungsten or its alloy.

In the electric connection-inspection device constituted as described above, the material for the third layer can be carbon, carbon containing a metal element, a nitride of metal or carbonitride. Among them, carbon containing a metal element of 0.5 to 50 atom % is preferable. That metal element can be at least one selected out of titanium, vanadium, niobium, zircon, molybdenum, tungsten, tantalum, hafnium, chrome, manganese, iron, cobalt and nickel.

In the electric connection-inspection device constituted as described above, preferably, the contact part is so constituted as to form a projection projected from the contact terminal. The projection can be a truncated pyramid shape.

In the electric connection-inspection device constituted as described above, the device can be constituted merely by the first layer and the second layer.

The electric connection-inspection device according to the present invention can be used as a probe or a probe card, or a socket or a contactor.

DESCRIPTION OF THE PREFERRED EMBODIMENTS

The present invention will be described in detail hereinafter on the basis of the embodiments thereof.

Figure 1:
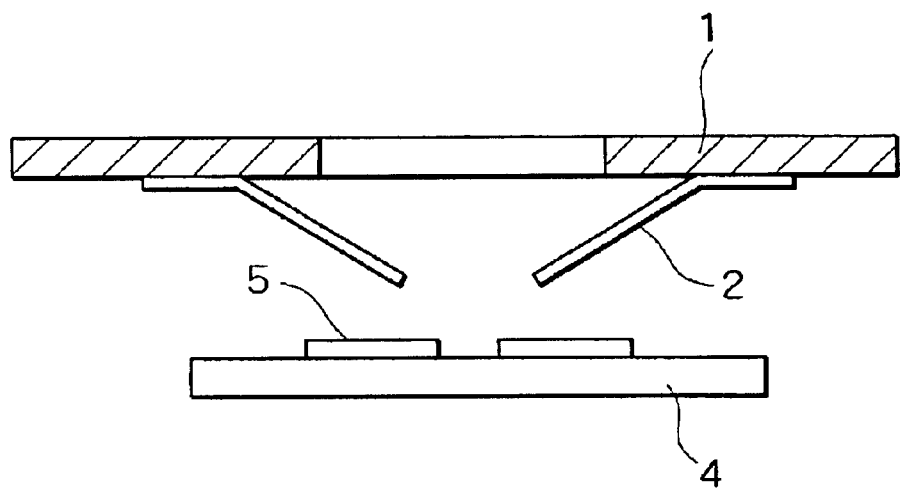
FIG. 1 is a sectional view showing a basic constitutional example of a conventional connection-inspection device.
Figure 2:
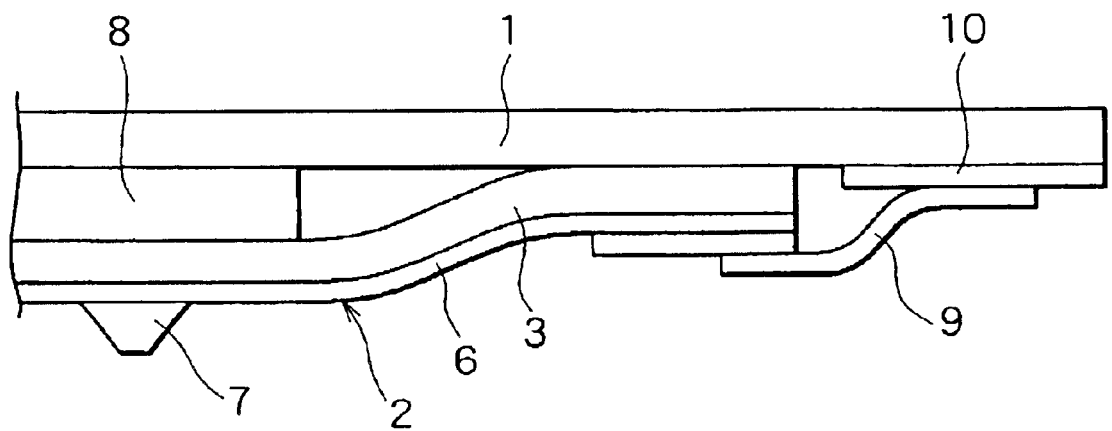
FIG. 2 is a sectional view showing a constitutional example of a probe card which is a conventional connection-inspection device according to the present invention.

FIG. 2 is a sectional view showing a constitutional example of a probe card which is a connection-inspection device according to the present invention. Herein, reference numeral 1 denotes a card substrate, and below the substrate is provided a contact terminal 2 formed at a small angle and projected obliquely downwardly. The contact terminal 2 comprises a drawing wiring 6 and a projection 7 positioned at the extreme end thereof to be an electric conduction contact point, and the upper surface thereof is stretched on a film substrate 3. An extreme end area including the projection 7 of the contact terminal 2 is supported and secured to the card substrate through a buffer material 8. Further, the drawing wiring 6 of the contact terminal 2 is connected to a wiring electrode 10 through an extension wiring 9. A number of the contact terminals 2 constructed as described are disposed closely on and around the card substrate 1.

Figure 3:
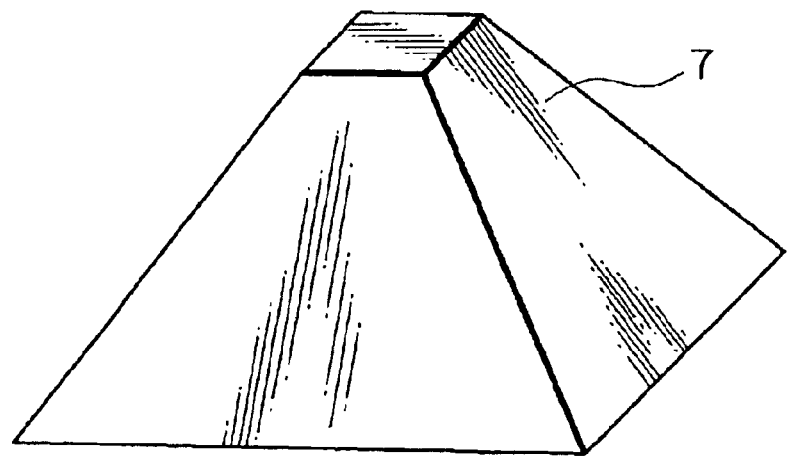
FIG. 3 is a perspective view of main parts enlarged of FIG. 2.
Figure 4:
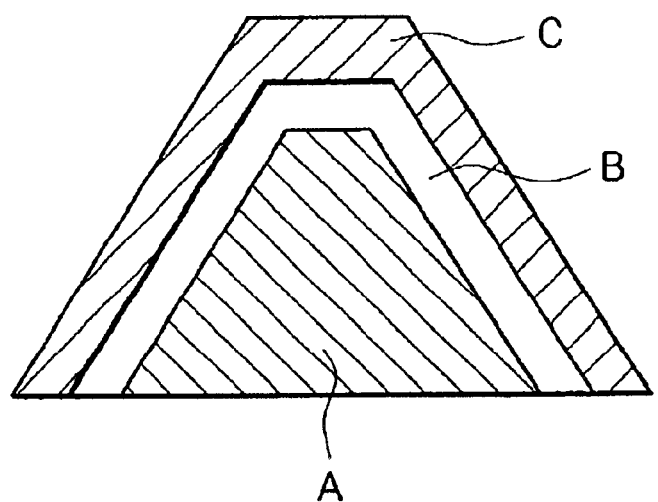
FIG. 4 is a sectional view of main parts enlarged of FIG. 2.

The present invention is featured in that a peculiar constitution is given to particularly a portion of the projection 7 of the contact terminal 2. FIGS. 3 and 4 are an enlarged perspective view and an enlarged sectional view, respectively, with the projection 7 shown in FIG. 2 viewed from the bottom. The shape of the projection 7 presents a truncated pyramid shape as shown in FIG. 3, which construction is a three-layer construction, as shown in FIG. 4, comprising an internal base-material wiring layer (A), a coating (B) of a second layer (hereinafter sometimes merely referred to as a second layer) having a higher Young's modulus than the base-material wiring layer (A) covering the surface of the latter and whose specific resistance is not more than $1 \times 10^{-4}$ $\Omega$cm, and a coating (C) of a third layer (hereinafter sometimes merely referred to as a third layer) having a low coagulating property on the surface of the coating (B) of the second layer. Dimensions of the shape of the projection 7 are of a fine construction that one side of a square of the upper surface to be the contact point of the extreme end is 0 to 10 $\mu$m, one side of the bottom surface is 20 to 100 $\mu$m, and the thickness of the drawing wiring is 10 to 30 $\mu$m.

For the base-material wiring layer (A), relatively soft pure metal which is low in electric resistance and is easily plated is used. For example, with respect to the electric resistance, the specific resistance is preferably $1 \times 10^{-5}$ $\Omega$cm or less. Specifically, gold, silver, copper, nickel and their alloy are suitable.

The second layer (B) is a film of wall-thickness formed covering the surface of the base-material wiring layer (A), and a thickness thereof is preferably 3 $\mu$m or more, particularly preferably 5 $\mu$m or more. The thickness termed herein is defined by the minimum value in consideration of the case where it changes depending on the places.

At the same time, the second layer (B) is essential that the Young's modulus is higher than that of the base-material wiring layer (A). Particularly, the Young's modulus of the second layer (B) is preferably 150 GPa or more, and more preferably 200 GPa or more.

Further, for the second layer (B), it is necessary to use material whose specific resistance is $1 \times 10^{-4}$ $\Omega$cm or less. Preferably, it is better that a low resistance material of $1 \times 10^{-5}$ $\Omega$cm or less be selected.

As the material for the second layer (B), specifically, metal such as tungsten, tantalum, titanium, niobium, molybdenum, zircon, cobalt and so on, or their alloys are suitable, and among them, tungsten or its alloy is particularly suitable material. Further, as other materials, metal of a platinum group such as platinum, iridium, radium and rhodium or their alloys may be used.

Next, it is desirable that the third layer (C) is a coating having a low coagulating property, and besides, being provided with both abrasion resistance and oxidation resistance.

As material for the third layer (C), carbon and material in which metal element is contained in carbon are preferable. Particularly, a material is preferable in which in carbon is contained pure metal such as titanium, vanadium, niobium, zircon, molybdenum, tungsten, tantalum, hafnium, chrome, manganese, iron, cobalt and nickel, or a part of their alloys. In this case, adequately, the content of the metal element relative to carbon is 0.5–50 atom %. Further, as materials other than those mentioned above, nitride of metal or carbonitride such as aluminum nitride, titanium nitride, aluminum carbonitride, titanium carbonitride, boron nitride, boron carbonitride, and the like are also useful.

As described above, the present invention is characterized in that the projection 7 at the extreme end of the contact terminal 2 is of the three-layer construction. In the following, the principle and operation of the present invention, and the ground for limiting numerical values thereof will be explained including the progress of studies made by the inventors or the like.

First, the inventors thought, in the fine contact terminal 2, particularly in connection with the projection 7 for which durability is demanded, that the way for solving the aforementioned problem brought forth where material of high strength is intended to be employed would be possibly opened by not constituting the whole projection 7 of a single material but making it to be a composite constitution. An idea reached is that the base-material wiring layer is formed of a material of relatively low strength and capable of being elastically deformed in consideration of electric feature and manufacture, and the outer circumferential surface thereof is coated with a shell of higher strength, that is, the second layer having the high Young's modulus, whereby the short in strength on the base-material side is compensated for to prevent its deformation and abrasion, thus having a possibility that as a whole, the durability can be maintained sufficiently.

However, there was expected, in realizing the above idea, a problem to be anxious about. That is, as a result that the material of high Young's modulus was coated on the base material, the coating layer has the high strength, and which internal stress becomes high, that depending upon the form of the coating layer, breakage or deterioration rather occurs in a short period of time, possibly impairing the durability.

Figure 8:
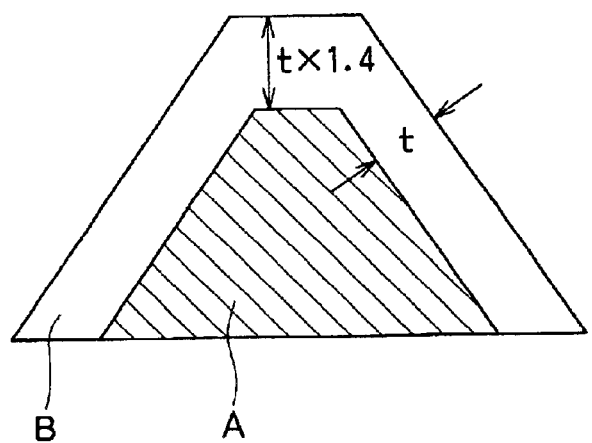
FIG. 8 is an enlarged sectional view of a projection as an object in analyzing a relationship between the thickness of a coating of the second layer and the maximum Mises stress.

In the light of the foregoing, the inventors pay attention to the thickness in the form of the second layer and carried out the following analysis. That is, there is used, as an object, a projection having a two-layer construction whose shape is a truncated pyramid shape as shown in FIG. 8, supposing that the Young's modulus of the base-material wiring (A) is made 45 GPa (value of gold is employed) and the Young's modulus of the second layer (B) is made 234 GPa (value of tungsten is employed), to which is vertically applied a load of 5 g, stress (Mises stress) induced in the second layer (B) when the thickness thereof is varied was obtained by computation. Further, computation of the stress was likewise tried to be carried out also in the case where the Young's modulus of the second layer (B) was varied. Here, the thickness of the second layer (B) is defined with a thickness (t) of an inclined portion of the truncated pyramid shown in FIG. 4, and the thickness of the upper surface was 1.4 times the thickness of the inclined portion (t×1.4). These computations were carried out using a general-purpose software [ABAQUS].

The Mises stress termed herein is a parameter used generally in the analysis of construction, which is closely related to a yield stress of work, and showing that the higher the value of the stress, plastic deformation tends to be received.

Figure 5:
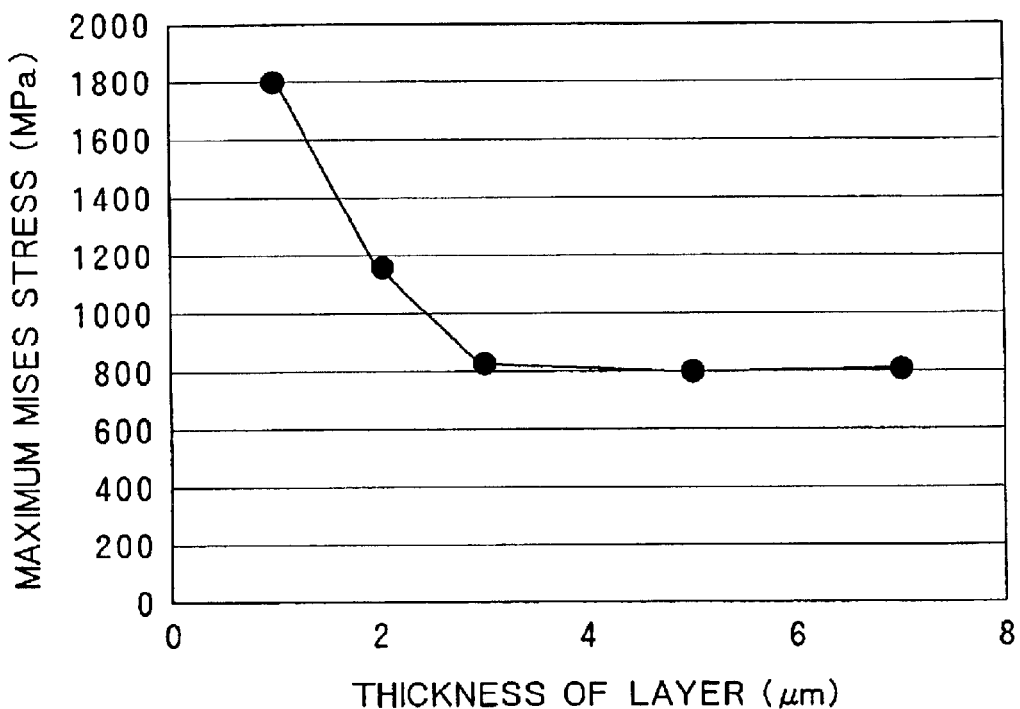
FIG. 5 is a graph showing a relationship between the thickness of a coating of a second layer and the maximum Mises stress.
Figure 6:
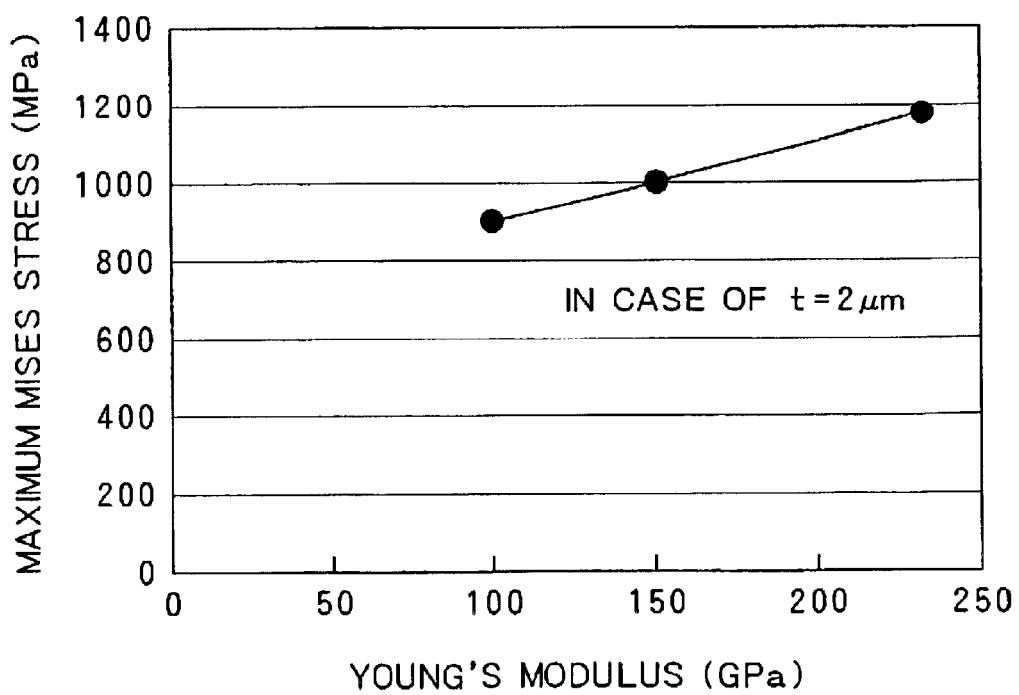
FIG. 6 is a graph showing, where the thickness of a coating of the second layer is 2 $\mu$m, a relationship between the Young's modulus and the maximum Mises stress.
Figure 7:
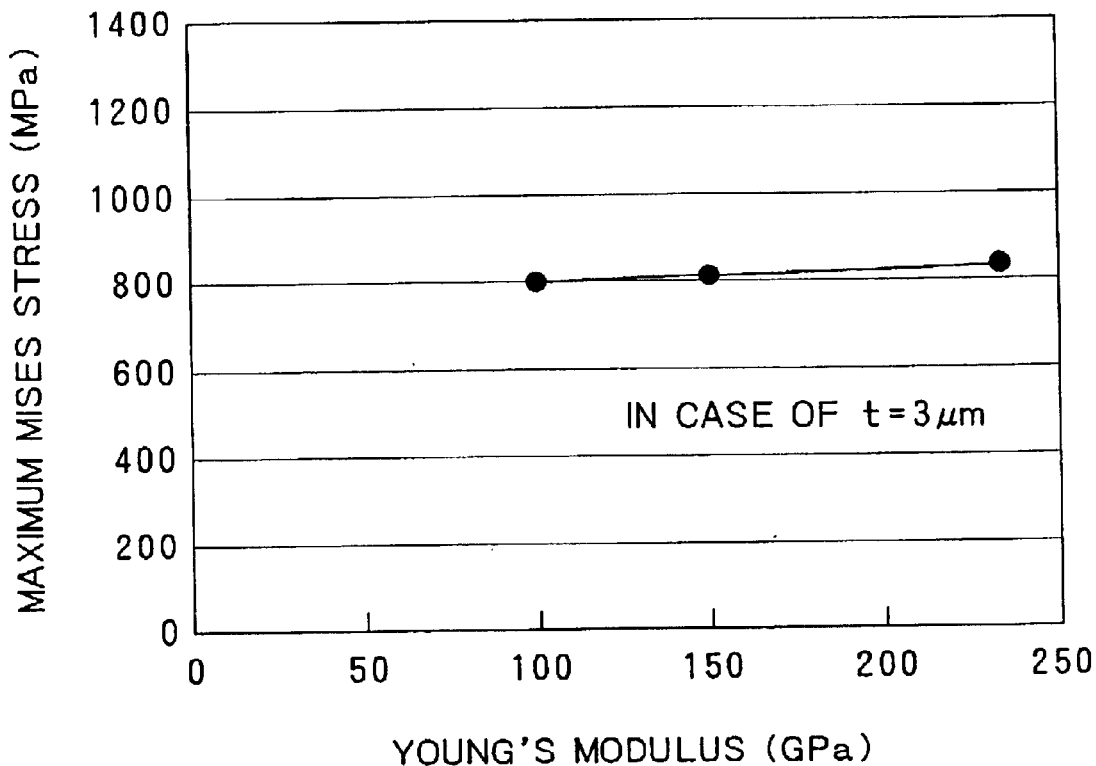
FIG. 7 is a graph showing, where the thickness of a coating of the second layer is 3 $\mu$m, a relationship between the Young's modulus and the maximum Mises stress.

FIGS. 5 to 7 collectively show the results of computation and analysis, and are graphs showing a relation between the thickness of the second layer and the maximum Mises stress in FIG. 5; a relation, where the thickness of the second layer is 2 $\mu$m, between the Young's modulus and the maximum Mises stress in FIG. 6; and a relation, where the thickness of the second layer is 3 $\mu$m, between the Young's modulus and the maximum Mises stress in FIG. 7, respectively. It can be understood from FIG. 5 that where the thickness of the second layer is 3 $\mu$m or more, the internal Mises stress is approximately 800 MPa and is not affected by variation of the layer thickness and being stabilized to be low, but when less than 3 $\mu$m, the stress rapidly increases as the layer thickness reduces, and particularly when 2 $\mu$m or less, the stress exceeds 1000 MPa and already reaches an area of plastic deformation. This is that where the second layer is 3 $\mu$m or more, the stress is stabilized to withstand the load, posing no problem in function, but where the thickness is 2 $\mu$m or less, it fails to withstand the load any longer resulting in breakage, completely losing a role of protection as an external shell, and a deformation in the internal base-material wiring layer starts, which namely means to result in the unusable condition as a contact terminal.

With respect to the aforementioned phenomenon, analysis and investigation were carried out in further detail. As a result, it was found that where the thickness of the second layer is 3 $\mu$m or more, stress in a direction of compression according to the load is induced in the layer, whereas in the layer of 2 $\mu$m or less, stress induced acts in a tensile direction, and a place where stress is induced is also changed according to the thickness. Additionally, a difference in mechanism also could be closely examined, between both cases, one where even in a construction of a thick film 3 $\mu$m or more, if an excessively large load is applied, the coating layer becomes crushed to result in breakage; and the other where in case of 2 $\mu$m or less, it is deformed so as to be broken and bent due to a lower load to result in breakage.

Further, it is understood that from FIG. 6, where the thickness of the second layer is 2 $\mu$m, when the Young's modulus of the second layer increases, the stress to be induced also tends to increase considerably in proportion thereto, whereas where the thickness is 3 $\mu$m, when the Young's modulus is at least within the range of 250 GPa or less, even if the Young's modulus increases, the stress merely increases slightly, and the Young's modulus rarely changes, remaining in approximately 800 MPa. This fact can be considered that in 3 $\mu$m or more, the magnitude of the Young's modulus of the second layer does not directly affect the breakage or deterioration caused by the internal stress. Therefore, as long as the second layer 3 $\mu$m or more is applied, it is possible naturally to employ, as material for the second layer of high strength, a material having the high Young's modulus. Accordingly, the enhancement of durability can be attempted, and freedom of selecting material such that material which is excellent in electric feature or the like can be selected in a range of allowable Young's modulus (for example, 100 GPa or more) is also to be widened.

These phenomena and facts are a novel and valuable discovery by the inventors themselves, and particularly, the thickness of the second layer greatly controls the strength and durability of the projection, i.e., the contact terminal, and moreover it has become clear that a criticality was considered for the thickness of 3 $\mu$m.

Accordingly, from the foregoing, particularly preferably, the lower limit of the thickness of the second layer having the high Young's modulus is 3 $\mu$m. On the other hand, with respect to the upper limit thereof, there is not particularly prescribed, but not more than 10 $\mu$m is preferable in consideration of the influence on other features such as electric resistance or the like.

Further, it is necessary in view of protecting the occurrence of deformation and breakage of the base-material wiring layer that the Young's modulus of the second layer is at least higher than the Young's modulus of the base-material wiring layer. It is desired that the Young's modulus be 150 GPa or more in a sense of securing excellent durability.

The second layer plays a part of a thick and hard shell for covering the surface of the wiring base-material layer as described above, and protects the base-material layer from its deformation or abrasion to thereby enhance and maintain the durability of the contact terminal. It is necessary to pay attention to the electric feature in association therewith In the present invention, as a material for the second layer, a material whose specific resistance is $1 \times 10^{-4}$ $\Omega$cm or less is selected in terms of securing the inspection accuracy. It is necessary to have a thick coating in order to effectively exhibit a part as the outer shell of the second layer, as a result of which the electric resistance increases, possibly failing to fulfill with the demanded feature as the contact terminal. For example, where the second layer is present in 5 $\mu$m, contact area of the typical probe card is 10 μm square, and therefore, the resistance value R is R=ρ×L/S (whereas S is a sectional area, and L is a length). And if the specific resistance is ρ(Ωcm), ρ×5×10² Ω results. As the probe card of this kind, it is generally required that the resistance value R is not more than 5×10⁻² Ω, and accordingly, it is necessary that the specific resistance is not more than 1×10⁻⁴ Ωcm. From a viewpoint of the relationship between the layer thickness and the electric resistance, the lower limit of the specific resistance for the material constituting the second layer is prescribed as described above.

Next, the present inventors have tackled and studied a problem of adhesion and coagulation of an electrode element relative to the contact terminal, and found that for the second layer, a material which is high in Young's modulus and low in specific resistance has to be used, and in addition, selection of a material which is excellent also in low coagulating property is extremely difficult in consideration of practical use. So, there reached a conclusion that the low coagulating property is separated from the part of the second layer, and that part is allowed to be borne by a coating formed independently on the outer surface of the second layer, that is, a coating of the third layer to enable solving also the problem of selecting material.

And, with respect to various materials, the aptitude as the third layer was experimented and studied, as a result of which it was confirmed that preferred is a carbon-base material, that is, carbon, or a material in which a suitable quantity of metal element such as titanium, vanadium, niobium, zircon, molybdenum, tungsten, tantalum, hafnium, chrome, manganese, iron, cobalt and nickel is contained in carbon To such a carbon-base material as described above, an electrode material is hard to adhere or coagulate even with respect to an electrode formed of soft metal such as solder or gold, that is provided with an excellent low coagulating property, is high in hardness and is excellent also in wear resistance. Further, such a material as described above has an oxidation resistance, exhibits its function with respect to not only own oxidation but also oxidation prevention of a coating of the internal second layer, and can be said an extremely useful material as the outermost layer.

Particularly, the material described above in which a suitable quantity of metal element is contained is characterized in that in addition to the feature as described, the aforementioned specific resistance is also low, and it is recommended as the optimum material.

In the following, experimental examples will be explained.

A carbon coating not containing metal and a carbon coating having a tungsten content changed were formed on the surface of an insulating substrate using a commercially available magnetron spatter device. Adjustment of the tungsten content in the carbon coating was carried out by placing chips of tungsten different in size on a graphite target within the device. Formation of a tungsten-contained carbon coating was done under the conditions of distance between target and substrate: 55 mm, Ar gas pressure: 3 mTorr, substrate temperature: room temperature, and charged power: 5.7 watt/cm².

Figure 9:
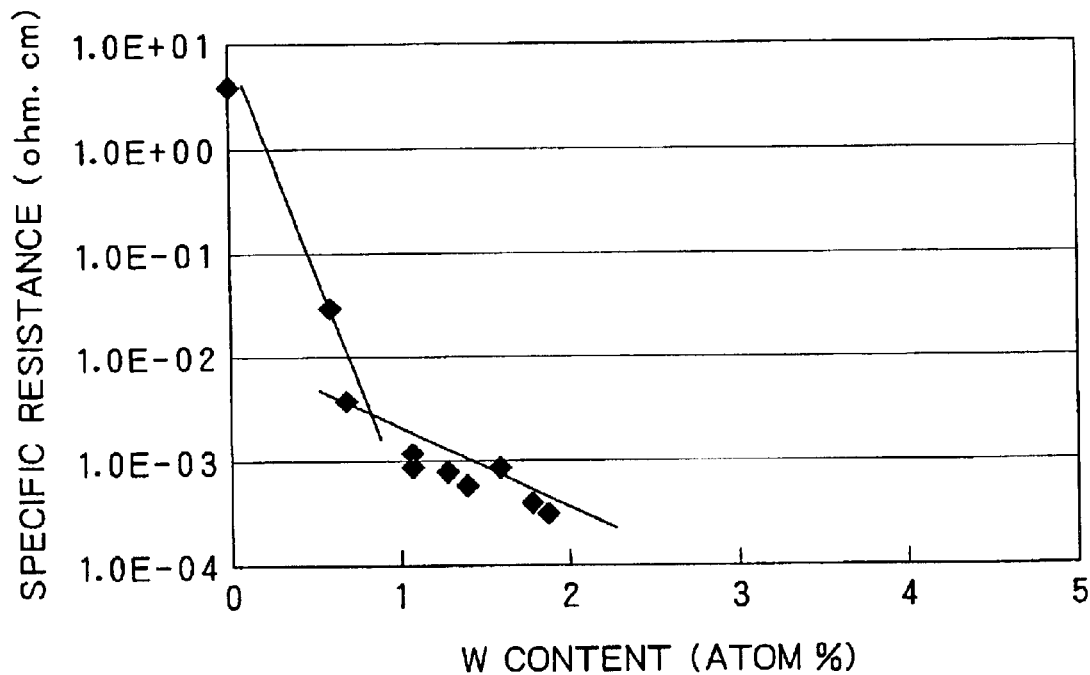
FIG. 9 is a graph showing a relationship between the tungsten content in a carbon coating constituting a third layer and the specific resistance.

FIG. 9 shows a relationship between the tungsten content of the carbon coating thus formed and the specific resistance. The value of the specific resistance was obtained by measuring the resistance by a 4-terminal measuring method and converting it from the thickness of a coating measured using a stylus type difference-in-level meter.

As will be apparent from FIG. 9, it is understood that the specific resistance of the carbon coating not containing tungsten is a few Ωcm, but reduces as the content of tungsten increases, and remarkably reduces in a region in excess of 1 atom %.

Further, the present inventors have also investigated about the tungsten content in the carbon coating and the hardness of a film (plastic deformation hardness). It is noted that the hardness of a film was measured by a nanoindentation method. The nanoindentation method termed herein is a method for evaluating a dynamic feature of the surface of a specimen, when an indentator which is sufficiently harder than a specimen such as diamond and is sharp in extreme end is vertically moved into the surface of the specimen, from the loaded load of the indentator and the depth of the movement, and is a measuring method capable of evaluating a film whose thickness is μm or less since the depth of the movement is in order of nanometer (nm). Further, also in the case where titanium is contained in a carbon coating, similar measurement was carried out.

Figure 10:
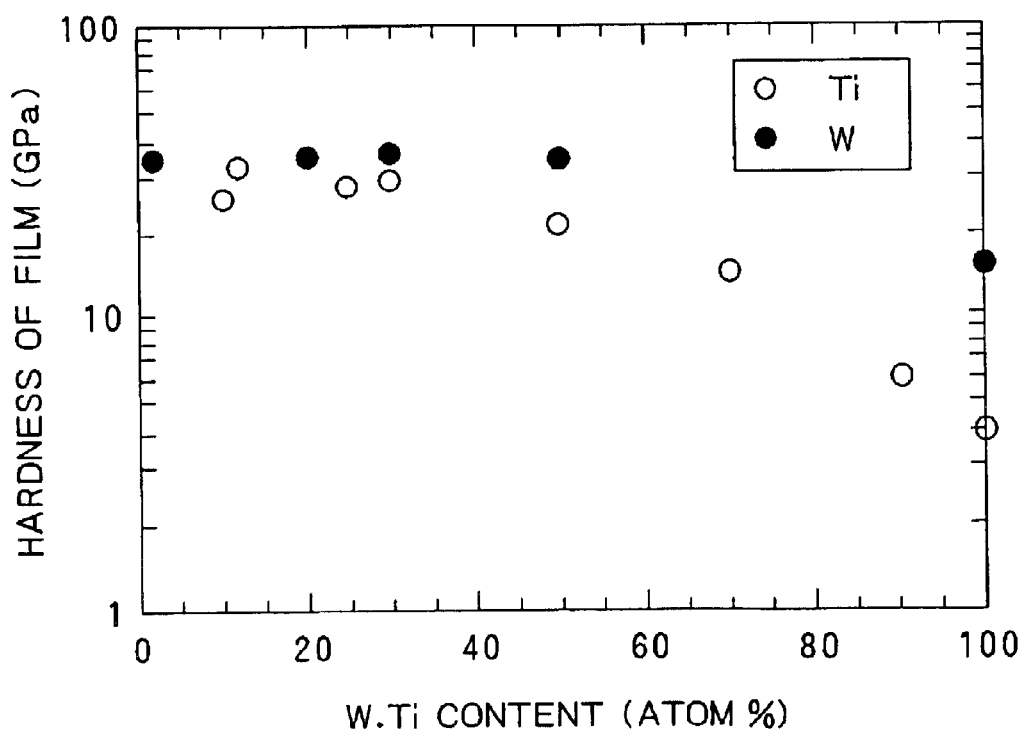
FIG. 10 is a graph showing a relationship between the tungsten content in a carbon coating constituting a third layer and the hardness of a film.

The results are shown in FIG. 10, from which consideration can be made as follows:

It is found that a metal element is contained whereby in 30 to 50 atom %, the hardness of a film is not much changed, but when exceeds 50 atom %, the hardness lowers rapidly and uniformly lowers toward 100%. As will be apparent from the fact described above, it is understood that in order to maintain the hardness essential to the carbon coating and maintain the wear resistance or durability so as to achieve the function as the third layer to be the outermost layer of the contact terminal, the content of the metal element in the carbon coating is desired to be not more than 50 atom %.

Further, it was confirmed that in the contact terminal in which the carbon coating was formed as the third layer, also with respect to the low coagulating property relative to the electrode metal, the content of metal element likewise exceeds 50 atom % whereby the feature essential to carbon is lost to thereby still deteriorate its function.

Incidentally, as the present form, the external shape of the projection 7 is shown as a truncated pyramid shape because, since it is stout in construction as a whole and an extreme end thereof is plane, the load can be dispersed and received, and there is an advantage that if an anisotropy etching is utilized, the manufacture is easy. Even if a truncated cone shape or other pyramid shape is used, the same effect results in terms of durability. Where the shape of the projection 7 is changed to another shape, the way of applying stress to inside is also changed, and the value of the maximum Mises stress or the critical thickness is expected to be changed, but it will not be greatly changed and the critical thickness will not be lost as long as the above-described conical or pyramid shape is employed.

Next, the method for manufacturing the connection-inspection device according to the present invention will be generally explained taking a probe card as an example. Indeed, the present invention is not characterized by the manufacturing method, but lies, as a gist, in the constitution of the device that has been described so far, particularly the construction of an extreme end of the contact terminal. Therefore, even those obtained by any manufacturing method including known or well known methods are included in the scope of the present invention as long as the above matter is fulfilled. Further, just like semi-conductor, in manufacturing the present device, lithography technique, etching technique, and microtechnology suitable for fine processing and formation such as plating, vaporization technique and the like are used freely.

In the manufacturing method of the present device (probe card), basically, the contact terminal 2 shown in advance in FIG. 2 is formed on a sacrifice substrate, the contact terminal 2 is connected to the card substrate 1 after which is separated from the sacrifice substrate, and the contact terminal 2 is transferred on the card substrate 1. Further, at that time, a sacrifice layer comprised of silicone dioxide is formed on the sacrifice substrate, and the silicone dioxide layer is dissolved to thereby separate the contact terminal 2.

The manufacture of the contact terminal 2 is divided into a step of manufacturing the third layer (C) of the projection 7, a step of manufacturing the second layer (B) of the projection 7, and a step of manufacturing the base-material wiring layer (A) and the drawing wiring 6 of the projection 7. First, a recessed portion having a truncated pyramid shape to be a mold of the projection 7 is formed by anisotropy etching. Subsequently, a material to be the third layer (carbon containing 1.5 atom % of tungsten, etc.) is vaporized on the inner surface of the recessed portion by spattering method to form a coating of 0.1 μm, for example. Subsequently, a material (such as tungsten) constituting the second layer is vaporized on the surface of the third layer formed within the recessed portion by spattering method to form a coating of 7 μm, for example. Further, a relatively soft material (such as gold) to be a wiring material is applied over the remaining entirety of the recessed portion and the drawing wiring area to integrally form a base-material wiring layer and a drawing wiring layer by plating method. Alternatively, a method may be employed to form the third layer and/or the second layer not only on the recessed portion but also on a part or the whole of the drawing wiring area.

The film substrate 3 and the buffer material 8 are adhered to the contact terminal 2 having the three-layer construction formed on the sacrifice substrate, the substrate sides are directly adhered to the lower surface of the card substrate 1, and the extreme end side is adhered through the buffer material 8. Thereafter, the sacrifice substrate is separated, and the drawing wiring 6 of the contact terminal 2 and the extended wiring 9, and the extended wiring 9 and the wiring electrode 10 are connected to complete a probe card.

Since the details of the above-described manufacturing process is illustrated in the column of the embodiments described in Japanese Patent Application No. 7172/2002 filed previously by the present inventors, only the outline thereof is explained here.

While in the aforementioned embodiments, three layers are formed on the projection 7, it is to be noted that the projection 7 may be constituted by two layers, i.e. the first layer and the second layer omitting the third layer as shown in FIG. 8. This form is also included in the scope of the present invention.

What is claimed is:

1. An electric connection-inspection device coming into electrical contact with an object to be inspected, to input and output a signal, comprising:

a plurality of contact terminals; and a plurality of contact parts positioned at extreme ends of said plurality of contact terminals, wherein each of said plurality of contact parts comprises:

a first layer formed from a wiring base-material, a second layer formed on the surface of said first layer and comprising a coating of material having the Young's modulus higher than a Young's modulus of said wiring base-material and a specific resistance not more than $1 \times 10^{-4}$ Ωcm, and a third layer formed on the surface of said second layer comprising a coating of material having a low coagulating property.

2. The electric connection-inspection device according to claim 1, wherein said second layer is formed of a material having the Young's modulus of 150 GPa or more.

3. The electric connection-inspection device according to claim 1, wherein said second layer has a thickness of 3 μm or more.

4. The electric connection-inspection device according to claim 1, wherein a material for said second layer is tungsten or tunnsten alloy.

5. The electric connection-inspection device according to claim 1, wherein a material for said third layer is selected from one of carbon, carbon containing a metal element, a nitride of metal and carbonitride.

6. The electric connection-inspection device according to claim 5, wherein a material for said third layer is carbon containing a metal element of 0.5 to 50 atom %.

7. The electric connection-inspection device according to claim 6, wherein said metal element is at least one selected out of titanium, vanadium, niobium, zircon, molybdenum, tungsten, tantalum, hafnium, chrome, manganese, iron, cobalt and nickel.

8. The electric connection-inspection device according to claim 1, wherein said contact part is in the form a projection projected from said contact terminal.

9. The electric connection-inspection device according to claim 8, wherein said contact part has a truncated pyramid shape.

10. The electric connection-inspection device according to claim 1, wherein said electric connection-inspection device is a probe or a probe card.

11. The electric connection-inspection device according to claim 1, wherein said electric connection-inspection device is a socket or a contactor.

12. An electric connection-inspection device coming into electrical contact with an object to be inspected, to input and output a signal, comprising:

a plurality of contact terminal; and a plurality of contact parts positioned at extreme ends of said plurality of contact terminals, each of said plurality of contact parts comprising:

a first layer formed from a wiring base-material, and a second layer formed on the surface of said first layer and comprising a material having the Young's modulus higher than the Young modulus of said wiring base-material, said second layer having a thickness of 3 μm or more.

13. The electric connection-inspection device according to claim 12, wherein said second layer is formed of a material having the Young's modulus of 150 GPa or more.

14. The electric connection-inspection device according to claim 12, wherein said second layer is formed of a material whose specific resistance is $1 \times 10^{-4}$ Ωcm or less.

15. The electric connection-inspection device according to claim 12, wherein said second layer has a thickness not less than 5 μm.

16. The electric connection-inspection device according to claim 12, wherein a material for said second layer is tungsten or tunasten alloy.

17. The electric connection-inspection device according to claim 12, wherein said contact part is in the form a projection projected from said contact terminal.

18. The electric connection-inspection device according to claim 17, wherein said contact part has a truncated pyramid shape.

19. The electric connection-inspection device according to claim 12, wherein said electric connection-inspection device is a probe or a probe card.

20. The electric connection-inspection device according to claim 12, wherein said electric connection-inspection device is a socket or a contactor.

* * * * *